United States Patent [19]

Yasuzato

[11] Patent Number: 5,636,005

[45] Date of Patent: Jun. 3, 1997

[54] OPTICAL PROJECTION ALIGNER EQUIPPED WITH ROTATABLE FLY-EYE LENS UNIT

[75] Inventor: Tadao Yasuzato, Tokyo, Japan

[73] Assignee: NEC Corporation, Tokyo, Japan

[21] Appl. No.: 381,235

[22] Filed: Jan. 31, 1995

[30] Foreign Application Priority Data

Jan. 31, 1994 [JP] Japan .................................. 6-027254

[51] Int. Cl.$^6$ ............................ G03B 27/72; G03B 27/54; H01L 21/30
[52] U.S. Cl. ............................. 355/71; 355/55; 355/67; 250/548
[58] Field of Search ............................ 355/53, 67, 70, 355/71; 250/548; 356/400, 401

[56] References Cited

U.S. PATENT DOCUMENTS 4,577,959  3/1986  Yazaki .......................... 355/67
5,383,000  1/1995  Michaloski et al. .......... 355/67

FOREIGN PATENT DOCUMENTS 61-91662  5/1986  Japan .

*Primary Examiner*—Arthur T. Grimley
*Assistant Examiner*—Herbert V. Kerner
*Attorney, Agent, or Firm*—Sughrue, Mion, Zinn, Macpeak & Seas

[57] ABSTRACT

A projection aligner is equipped with a diaphragm having four sectoral openings arranged in symmetry with respect to orthogonal symmetrical lines respectively aligned with two orthogonal directions of a reticle pattern, and a rotating system is provided for a fly-eye lens so as to align two orthogonal symmetrical lines of the fly-eye lens with the two orthogonal symmetrical lines of the diaphragm, thereby improving a resolution of the reticle pattern on a photo-resist layer.

10 Claims, 14 Drawing Sheets

OPTICAL PROJECTION ALIGNER EQUIPPED WITH ROTATABLE FLY-EYE LENS UNIT

FIELD OF THE INVENTION

This invention relates to a projection aligner and, more particularly, to a projection aligner equipped with a rotatable fly-eye lens unit for transferring a pattern onto a semiconductor wafer.

DESCRIPTION OF THE RELATED ART

In a fabrication process of a semiconductor integrated circuit device, various patterns are transferred onto a semiconductor wafer through lithographic techniques, and an optical reduction projection aligner usually transfers the patterns from masks to the semiconductor wafer. The optical reduction projection aligner presently available can transfer 0.5 micron line width for commercial products through an enlargement of numerical aperture of the projection optics. Although the enlargement of the numerical aperture enhances the resolution, the depth of focus is decreased, and the trade-off between the resolution and the depth of focus does not allow the optical reduction projection aligner to transfer a line width equal to or less than 0.35 micron at an acceptable throughput for commercial products.

An attractive illumination system is disclosed in Japanese Patent Publication of Unexamined Application No. 61-91662, and FIG. 1 illustrates the prior art projection aligner disclosed in this Japanese Patent Publication of Unexamined Application.

The prior art projection aligner comprises a light source 1, an elliptical mirror 2a, a cold mirror 3 and a lens 4. The light source 1 is implemented by an ultra high-pressure mercury lamp, and generates continuous spectrum light. The elliptical mirror 2a condenses and reflects the light toward the cold mirror 3, and the cold mirror 3 eliminates long-wavelength light from the continuous spectrum light. The cold mirror 3 reflects ultra violet and visible light toward the lens 4. In this instance, the mercury g-line at 436 nanometer wavelength or the mercury i-line at 365 nanometer wavelength is used in the pattern transfer, and these rays are in the majority in the reflected visible light. The lens 4 makes the reflected visible light parallel.

The prior art projection aligner further comprises an interference filter 5 and a fly-eye lens 6. The interference filter 5 only transmits the reflected visible or ultra violet light with the wavelength of 436 nanometers or 365 nanometers plus or minus several nanometers.

The fly-eye lens 6 is implemented by elongated rectangular single lens units bundled together, and makes the illumination uniform. The single lens units have respective focuses, and form a light source group. Although the ultra high-pressure mercury lamp 1 radiates incoherent light, the light passing through the fly-eye lens 6 serves as the light radiated from a point source, and is enhanced in coherence. The point sources are called an "effective light source".

The prior art projection aligner further comprises a diaphragm 7 for shaping the light supplied from the effective light source 6, a lens unit 8, a mirror 9 for reflecting the light toward a reticle 10, a lens unit 11 provided between the mirror 9 and the reticle 10 and a projection lens system 12. The diaphragm 7 gives a shape to the effective light source. The lens unit 8 and the mirror 9 change the optical path, and the change of the optical path makes the prior art projection aligner small. The reticle 10 is uniformly illuminated by virtue of the fly-eye lens 6, and the light transfers the pattern image through the projection lens system 12 to a photo-sensitive layer 13 coating a semiconductor wafer 14 mounted on an x–y stage (not shown). The photo-sensitive layer 13 is partially polymerized or depolymerized by the image-carrying light, and is, thereafter, developed, providing a mask layer on the semiconductor wafer 14. If a point light source were used to illuminate the reticle 10, the light rays would travel through respective optical paths from the point light source to respective points on the reticle 10, and the optical paths would be different in length depending upon the points on the reticle 10. The different lengths would destroy the uniformity of the illumination. For this reason, the fly-eye lens 6 is used instead of a point light source.

Next the influence of the diaphragm 7 provided after the fly-eye lens 6 will be described with reference to FIGS. 2A, 2B 3A and 3B of the drawings. The diaphragm 7 is usually shaped into a ring, and, accordingly, has a circular opening 7a as shown in FIG. 2A. If a rectangular opening was formed in the diaphragm 7, the resolution would differ between patterns in directions parallel to the four edges and patterns in oblique directions to the four edges such as 45 degrees and 135 degrees. The circular opening 7a determines the numerical aperture NA of the illumination optics. The numerical aperture NA of the illumination optics as well as that of the projection optics affects the resolution characteristics, and sigma is defined as a ratio between NA of the illumination system and NA of the projection lens system 12. Sigma indicates the magnitude of the effective light source, and the transparent area of the reticle 10 is determined in such a manner that sigma falls into a range between 0.3 to 0.7. For example, a line-and-space pattern formed on the reticle 10 requires relatively large sigma, and relatively small sigma is appropriate for an image pattern for an isolated contact hole. The diaphragm 7 is further expected to optimize the shape of the effective light source. If the circular opening 7a is formed in the diaphragm 7 as shown in FIG. 2A, the light radiated from the fly-eye lens 6 is vertically incident into the reticle 10 as shown in FIG. 3A. In general, 0-order light and either +1 or −1 order light are available for the resolution of the image pattern on the reticle 10, and a reticle image pattern 10a allows the light to be transferred to the projection lens system 12. However, if the image pattern 10a is miniaturized, the diffraction angle becomes large, and the light is hardly incident into the projection lens system 12. The diaphragm 7 allows only 0-order light to pass therethrough, and only the 0-order light is incident into the projection lens system 12. The 0-order light decreases the contrast on the photo-sensitive layer 13, and the pattern image is hardly transferred to the photo-sensitive layer 13 due to the poor contrast.

However, if the diaphragm 7 is replaced with a diaphragm 7b as shown in FIG. 2B, sectoral openings 7c allow only an oblique light L1 to be incident into the reticle 10 as shown in FIG. 3B, and either +1 or −1 order light passes through the projection lens system 12 to the photo sensitive layer 13. The diaphragm 7b eliminates the undesirable vertical light from the incident light, and the illumination through the four sectoral opening is called "four-point illumination". As a result, the miniature pattern 10a is transferred to the photo-sensitive layer 13.

If an image pattern is repeated in two directions, the four-point illumination effectively transfers the image pattern. A diaphragm with two openings is appropriate for an image pattern formed by either longitudinal or lateral lines, and a ring-shaped opening is also used for a miniature image pattern for improving the resolution.

However, an oblique arrangement of circuit components 15 is frequently used for an ultra large scale integration as shown in FIG. 4, because the oblique arrangement enhances the integration density of the circuit components 15. In FIG. 4, the orthogonal coordinates x'-y' indicate directions of the oblique arrangements, and turn over angle A1 from the standard orthogonal coordinate x-y. The angle A1 has been zero or 45/135 degrees. However, an ultra large scale integration of the next generation requires an oblique arrangement oriented to an intermediate angle between 0/45/90/135 degrees such as 15 degrees for increasing the integration density. In this situation, the prior art projection aligner encounters the problem of low resolution of the pattern image.

SUMMARY OF THE INVENTION

It is therefore an important object of the present invention to provide a projection aligner which transfers an oblique pattern image from a reticle to a photosensitive layer at high resolution.

The present inventor had contemplated the problem, and noticed that a fly-eye lens did not uniformly illuminate a reticle. In detail, the present inventor measured the optical intensity along line A—A in an effective area 16a of a fly-eye lens 16 shown in FIG. 5, and plotted the measured optical intensity in FIG. 6. As indicated by OPT, the intensity peaked at the center of each single lens unit. However, the peak value was waved, and was maximized at the center of line A—A.

In general, if more than ten miniature single lens units form the fly-eye lens, the number of point light sources and the positions thereof did not affect the image forming characteristics, and the semiconductor device manufacturer considered the fly-eye lens to be a uniform illumination source. This assumption had been acceptable in a pattern transfer for a standard large scale integration. However, if a modified illumination such as the four-point illumination was employed, the relatively high-intensity single lens units in the central area of the fly-eye lens were masked by the central area of the diaphragm 7b, and, accordingly, the luminance was lowered. In this situation, if an image pattern was oriented to an intermediate angle except for 0/90 degrees or 45/135 degrees, the four-sectoral openings 7c of the diaphragm 7b were irregularly aligned with the centers CT of the relatively low-intensity single lens units 6a in the peripheral area of the fly-eye lens as shown in FIG. 7, and further deteriorated the distribution of the illuminance.

The present inventor concluded that the low resolution was derived from the irregular alignment between the centers of the single lens units and the openings of the diaphragm.

To accomplish the object, the present invention rotates a fly-eye lens for regularly aligning centers of single lens units with open sub-areas of a diaphragm.

In accordance with one aspect of the present invention, there is provided an aligner for transferring a pattern image from a reticle to a photo-sensitive layer, comprising: a partial coherent light generating system having a fly-eye lens implemented by a plurality of single lens units for producing a partial coherent light; a diaphragm having an open area so as to cause the partial coherent light to be incident into the reticle for generating the pattern image which is to fall onto the photosensitive layer; and a rotating system associated with the fly-eye lens for regulating the relative relation between the fly-eye lens and the reticle through a rotation of the fly-eye lens.

In accordance with another aspect of the present invention, there is provided an aligner for transferring a pattern image from a reticle to a photo-sensitive layer, comprising: a partial coherent light generating system having a fly-eye lens implemented by a plurality of single lens units for producing a partial coherent light, the partial coherent light illuminating the reticle for generating the pattern image which is to fall onto the photo-sensitive layer; a diaphragm having an open area so as to transfer the partial coherent light to the reticle; and a rotating system associated with the fly-eye lens for regulating relative relation between the fly-eye lens and the reticle through a rotation of the fly-eye lens.

BRIEF DESCRIPTION OF THE DRAWINGS

The features and advantages of the optical projection aligner according to the present invention will be more clearly understood from the following description taken in conjunction with the accompanying drawings in which.

DESCRIPTION OF THE PREFERRED EMBODIMENTS

First Embodiment

Figure 8:
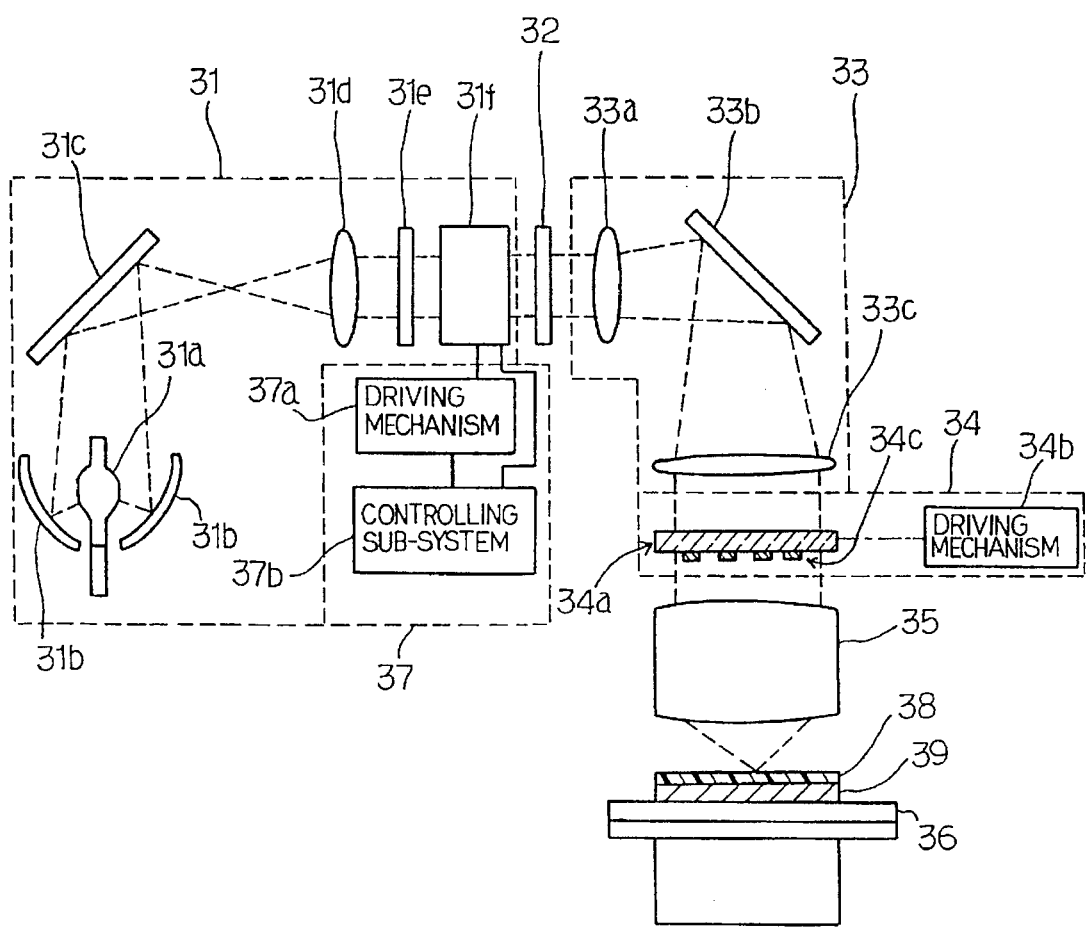
FIG. 8 is a schematic view showing an optical reduction projection aligner according to the present invention.

Referring to FIG. 8 of the drawings, an optical reduction projection aligner embodying the present invention largely comprises a partial coherent light generating system 31, a diaphragm 32, an optical path guide system 33, a reticle transfer system 34, a projection lens unit 35, a movable stage 36 and a rotating system 37.

The partial coherent light generating system 31 comprises an ultra high-pressure mercury lamp unit 31a, elliptical mirrors 31b provided around the ultra high-pressure mercury lamp 31a and a cold mirror 31c provided in an optical path reflected from the elliptical mirrors 31b.

The ultra high-pressure mercury lamp 31a generates continuous spectrum light, and, accordingly, the light generated by the ultra high-pressure mercury lamp 31a is not coherent. The elliptical mirrors 31b condense the light, and reflect the light along the optical path toward the cold mirror 31c. The cold mirror 31c eliminates long-wavelength light components from the light generated by the ultra high-pressure mercury lamp 31a, and reflects ultraviolet and visible light components.

The partial coherent light generating system 31 further comprises a lens unit 31d, an interference filter unit 31e and a fly-eye lens unit 31f. The lens unit 31d makes the ultra-violet and visible light parallel, and the interference filter 31e only transmits an ultra-violet light component or a visible light component used in a pattern transfer to the fly-eye lens 31f. For this reason, the visible light component with target wavelength and plus or minus several nanometers is incident into the fly-eye lens unit 31f. In this instance, the mercury i-line is used for the pattern transfer.

The fly-eye lens unit 31f enhances the coherency of the visible light component, and serves as an effective light source for partial coherent light. The fly-eye lens 31f is implemented by a plurality of rectangular single lens units arranged in a matrix, and serves as an effective light source. As will be described hereinlater, the fly-eye lens 31f is accommodated in a lens barrel 31g (see FIG. 9), and the rotating system 37 is associated with the fly-eye lens unit 31f.

A shutter may be provided between the cold mirror 31c and the lens 31d, and a masking system may be provided between the diaphragm 32 and the optical path guide system 33.

The diaphragm 32 has an open area for transmitting a bundle of the coherent light rays, and shapes the bundle of the coherent light rays. The diaphragm 32 is replaced with another diaphragm depending upon a reticle pattern formed on a reticle 34a. The diaphragm 32 is used for four-point illumination, and the open area is divided into four sectoral open sub-areas as similar to the diaphragm 7b used for the prior art reduction projection aligner.

The optical path guide system 33 comprises a lens unit 33a, a reflecting mirror 33b and a lens unit 33c. The lens unit 33a allows the partial coherent light to fall on the reflecting mirror 33b, and the mirror 33b changes the optical path at a certain angle. The partial coherent light reflected on the mirror 33b is incident into the lens unit 33c, and is transferred to the reticle 34a. Since the optical path guide system 33 bends the optical path, the lateral distance of the projection aligner is decreased. However, in a projection aligner wherein the optical path extends straightly, the optical path guide system 33 may be deleted from the projection aligner.

The reticle transfer system 34 has a driving mechanism 34b for moving the reticle 34a into and out of the optical path. The partial coherent light uniformly illuminates the reticle 34a, and transfers the pattern image through the projection lens system 35 to the movable stage 36. A photo-resist layer 38 covering a semiconductor wafer 39 is mounted on the movable stage 36, and the movable stage 36 causes the pattern image to be focused on a predetermined area of the photo-resist layer 38.

The photo-resist layer 38 is partially polymerized or depolymerized by the image-carrying light, and is, thereafter, developed for providing a mask layer on the semiconductor wafer 39.

Figure 9:
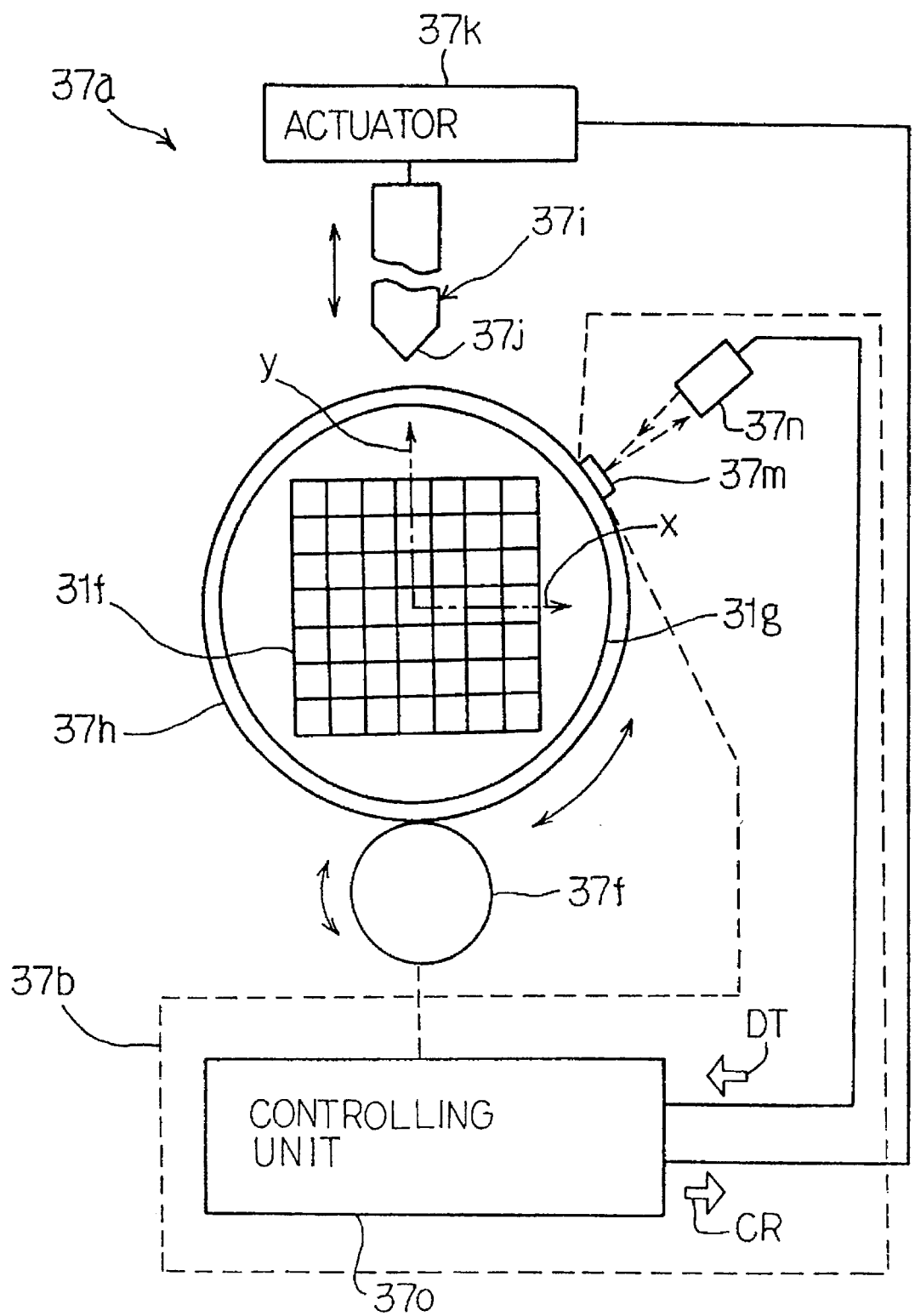
FIG. 9 is a front view showing a driving mechanism for a fly-eye lens incorporated in the optical reduction projection aligner according to the present invention.
Figure 10:
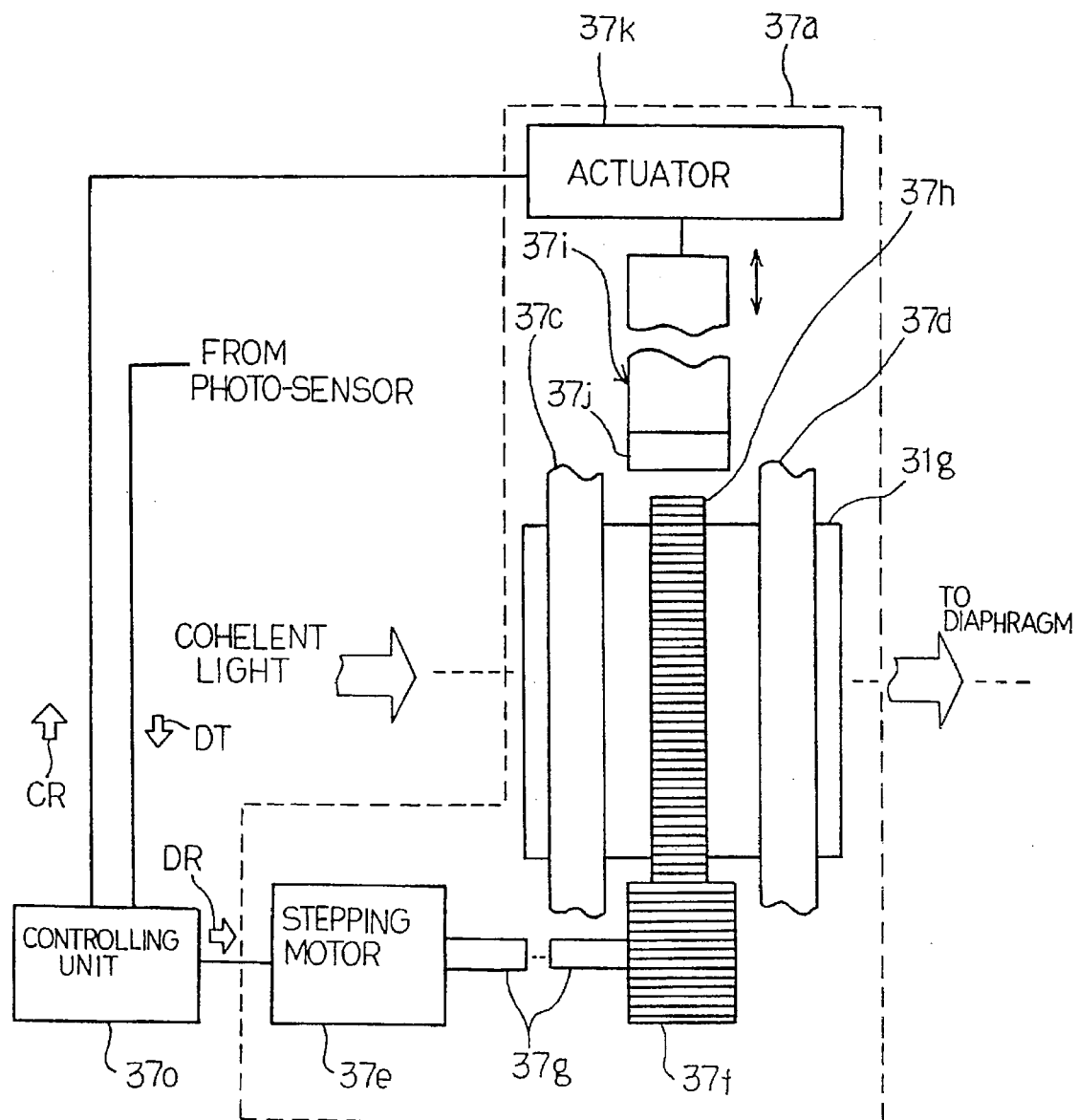
FIG. 10 is a side view showing the driving mechanism for the fly-eye lens.

Turning to FIGS. 9 and 10, the rotating system 37 is broken down into a driving mechanism 37a and a controlling sub-system 37b. The driving mechanism 37a comprises bearing units 37c/37d for rotatably supporting the lens-barrel 31g. Though not shown in FIGS. 9 and 10, the bearing units 37c and 37d are fixed to bracket members of the reduction projection aligner, and allow the lens-barrel 31g to be rotated with respect to the bracket members. The diaphragm 32 and the reticle 34a placed in the optical path are stationary with respect to the bracket members, and, for this reason, the lens-barrel 31g and, accordingly, the fly-eye lens 31f are rotatable with respect to the diaphragm 32 and the reticle 34a.

The driving mechanism 37a further comprises a stepping motor 37e, a small gear 37f connected through a shaft 37g to the stepping motor 37e and a large gear 37h fixed to the outer surface of the lens-barrel 31g. The stepping motor 37e is responsive to a driving pulse train DR, and bidirectionally rotates the small gear 37f. The small gear 37f is meshed with the large gear 37h, and transfers the rotation to the large gear 37h. The large gear 37h has 360 tooth so that the lens-barrel 31g and the fly-eye lens 31f change the angular position thereof by 1 degree.

The driving mechanism 37a further comprises a stopper 37i with a teeth 37j engageable with the large gear 37h and an actuator 37k for reciprocally moving the stopper 37i. The tooth 37j is shaped to have the same pitch as the large gear 37h, and is snugly engageable with the teeth of the large gear 37h. While the actuator 37j retracts the stopper 37i, the tooth 37j is spaced from the tooth of the large gear 37h, and the large gear 37h is freely rotatable. If the actuator 37k projects the stopper 37i, the tooth 37j of the stopper 37i is brought into meshing engagement with a tooth of the large gear 37h, and the stopper 37i does not allow the large gear 37h to be rotated with respect to the stationary bracket members and, accordingly, the reticle 34a.

The controlling sub-system 37b is associated with the driving mechanism 37a, and has a mark plate 37m with a slit attached to the outer surface of the lens-barrel 31g, a photo-sensor 37n for detecting the mark plate 37m and a controlling unit 37o connected to the stepping motor 37e, the photo-sensor 37m and the actuator 37k. The photosensor 37m supplies a detecting signal DT indicative of a standard position of the fly-eye lens 31f to the controlling unit 37o, and the controlling unit 37o supplies the driving pulse train DR and a driving current CR to the stepping motor 37e and the actuator 37k, respectively.

The mark plate 37m and the photo-sensor 37n are regulated such that the photo-sensor 37n detects the slit of the mark plate 37m at the standard position of the fly-eye lens 31f, and orthogonal coordinates x-y of the fly-eye lens 31f is aligned with the orthogonal coordinates x'-y' of the reticle 34a at the standard position. The x-axis and the y-axis serve as symmetrical lines of the fly-eye lens 31f.

Description is hereinbelow made on a regulation between the fly-eye lens 31f, the diaphragm 32 and an oblique reticle pattern 34c formed on the reticle 34a carried out before a pattern transfer onto the photo-resist layer 38. The oblique reticle pattern 34c is oriented to a direction D1, and is repeated in a direction D2 perpendicular to the direction D1. The directions D1 and D2 decline at 15 degrees with respect to the standard orthogonal coordinates x'–y' of the reticle 34a or a semiconductor integrated circuit device, and the interval in the direction D2 is 0.35 micron.

Figure 11A:
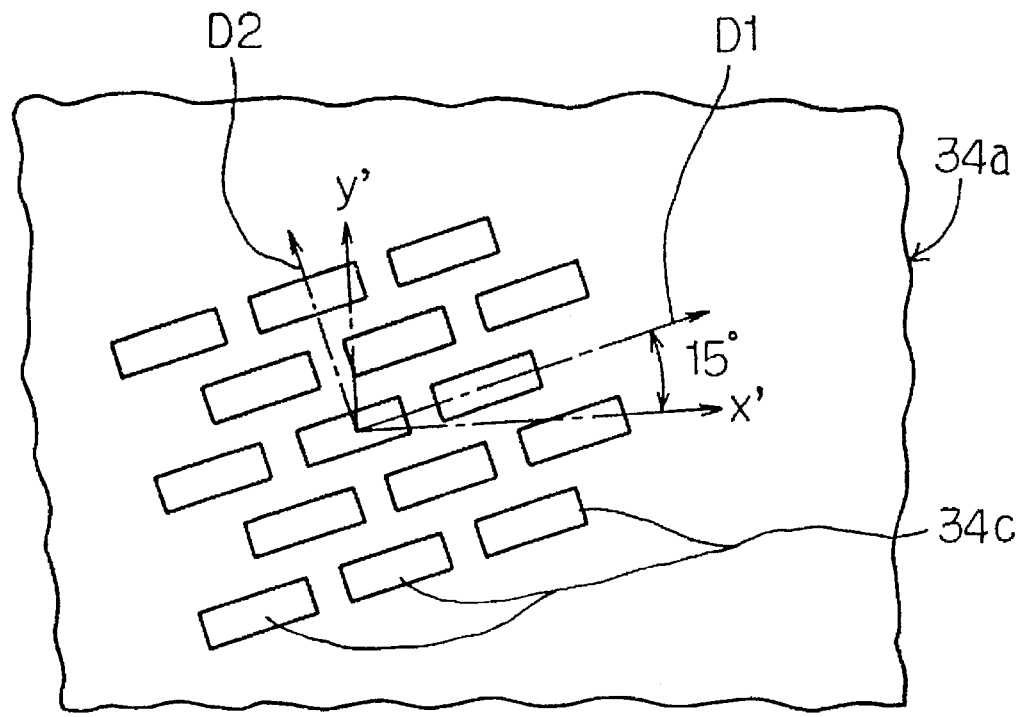
FIGS. 11A to 11D are plan views showing relation among the fly-eye lens, a diaphragm and a pattern image on a reticle.
Figure 11B:
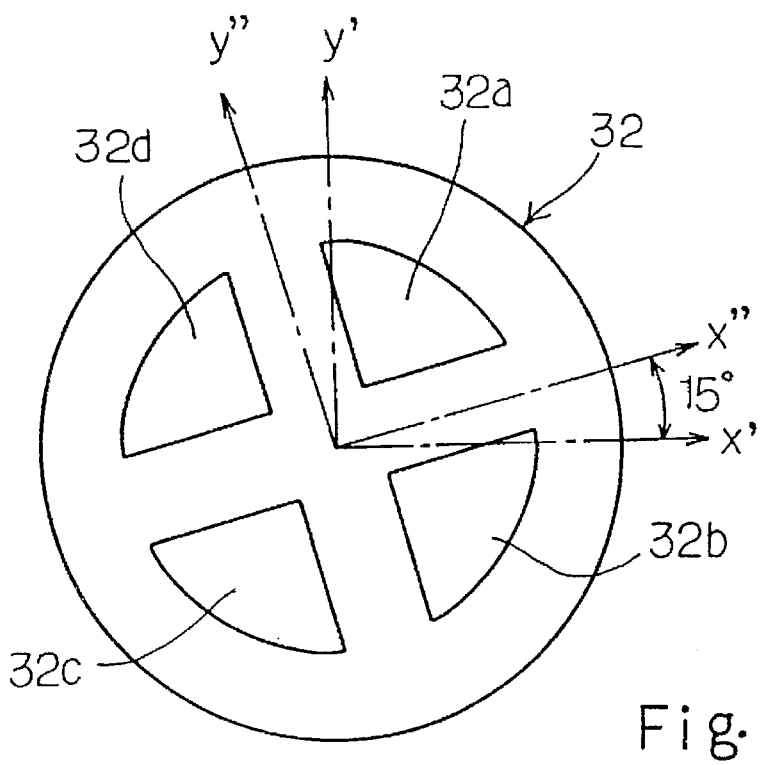

The numerical aperture NA of the optical reduction projection aligner is regulated to 0.6, and sigma or the ratio between NA of the illumination system and NA of the projection lens system 35 is 0.6. The diaphragm 32 has an open area implemented by four sectoral openings 32a, 32b, 32c and 32d, and the orthogonal coordinates or the symmetrical lines x"–y" declines at 15 degrees with respect to the orthogonal coordinates x'–y' as shown in FIG. 11B. Therefore, the symmetrical lines x"–y" are aligned with the directions D2 and D1.

The controlling unit 37o supplies the driving pulse train DR to the stepping motor 37e, and the lens-barrel 31g and the fly-eye lens 31f are driven for rotation until the photo-sensor 37n detects the mark plate 37m. When the photo-sensor 37n detects the mark plate 37m, the photosensor 37n supplies the detecting signal DT to the controlling unit 37o, and the controlling unit 37o stops the driving pulse train DR. The fly-eye lens 31f reaches the standard position, and the standard orthogonal coordinates x–y of the fly-eye lens 31f is aligned with the standard orthogonal coordinates x'–y' of the reticle 34a.

Figure 1:
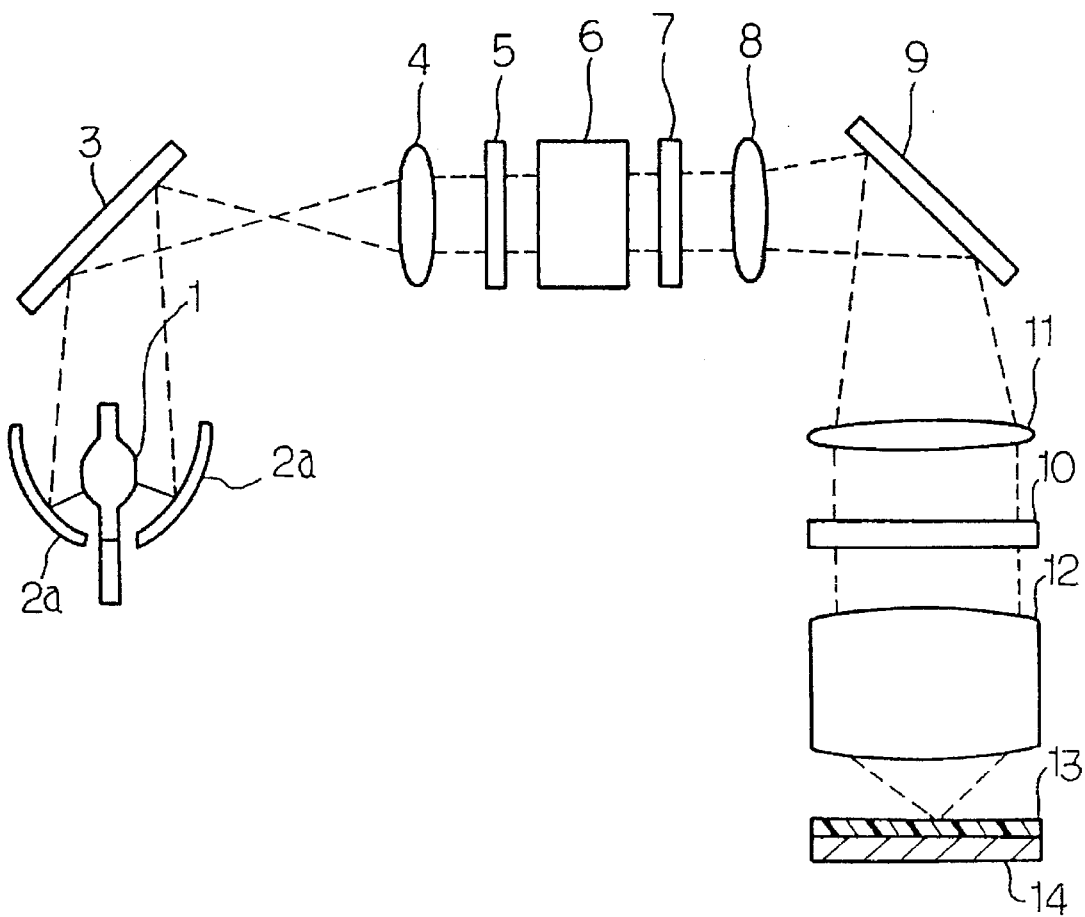
FIG. 1 is a schematic view showing the prior art optical reduction projection aligner.
Figure 2A:
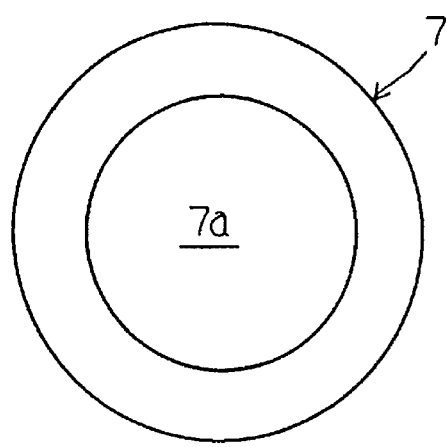
FIGS. 2A and 2B are front views showing diaphragms used in the prior art optical reduction projection aligner.
Figure 2B:
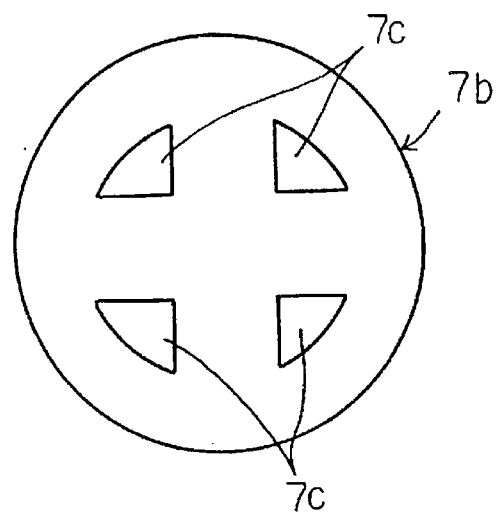
Figure 3A:
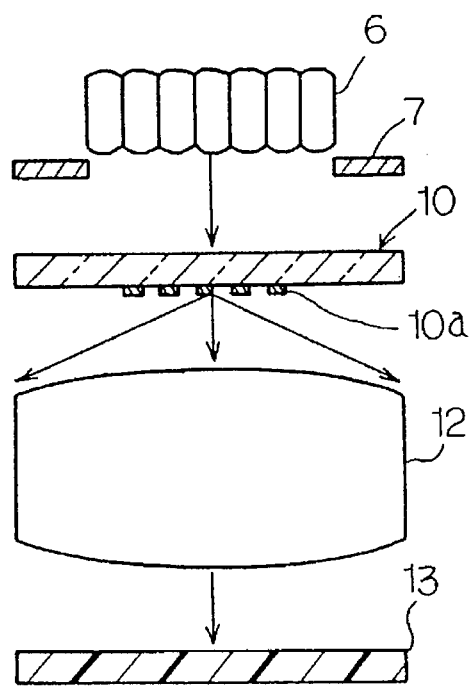
FIG. 3A is a partially cross sectional side view showing the standard illumination using the diaphragm shown in FIG. 2A.
Figure 3B:
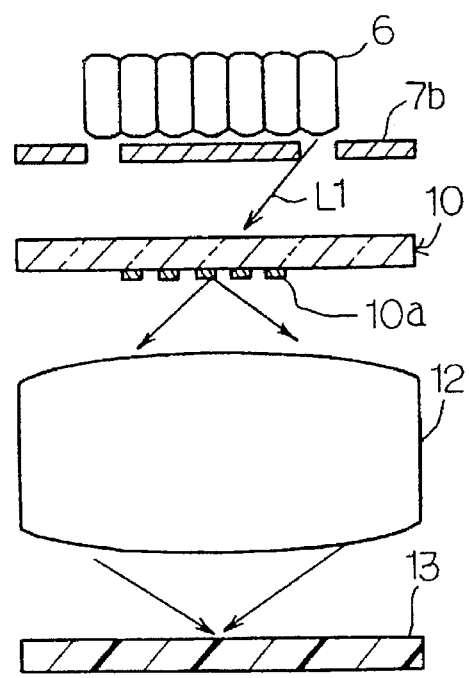
FIG. 3B is a partially cross sectional side view showing the four-point illumination using the diaphragm shown in FIG. 2B.
Figure 4:
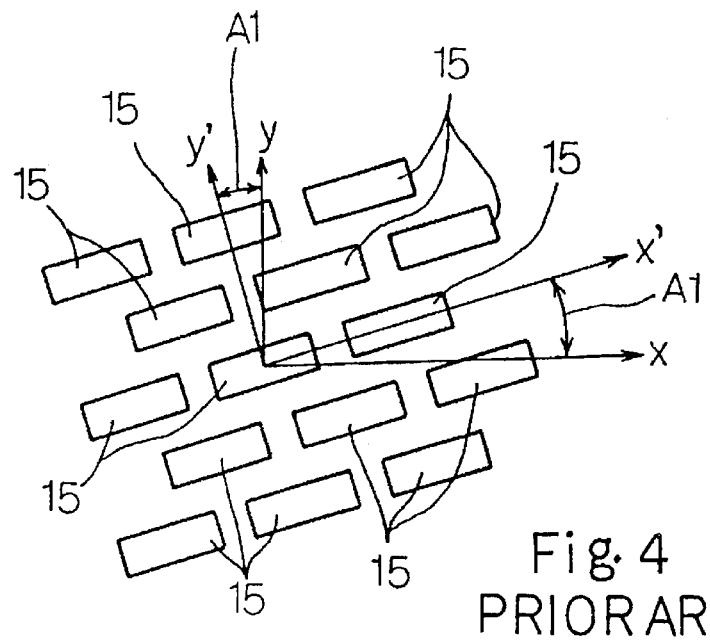
FIG. 4 is a plan view showing the obliquely oriented pattern image.
Figure 7:
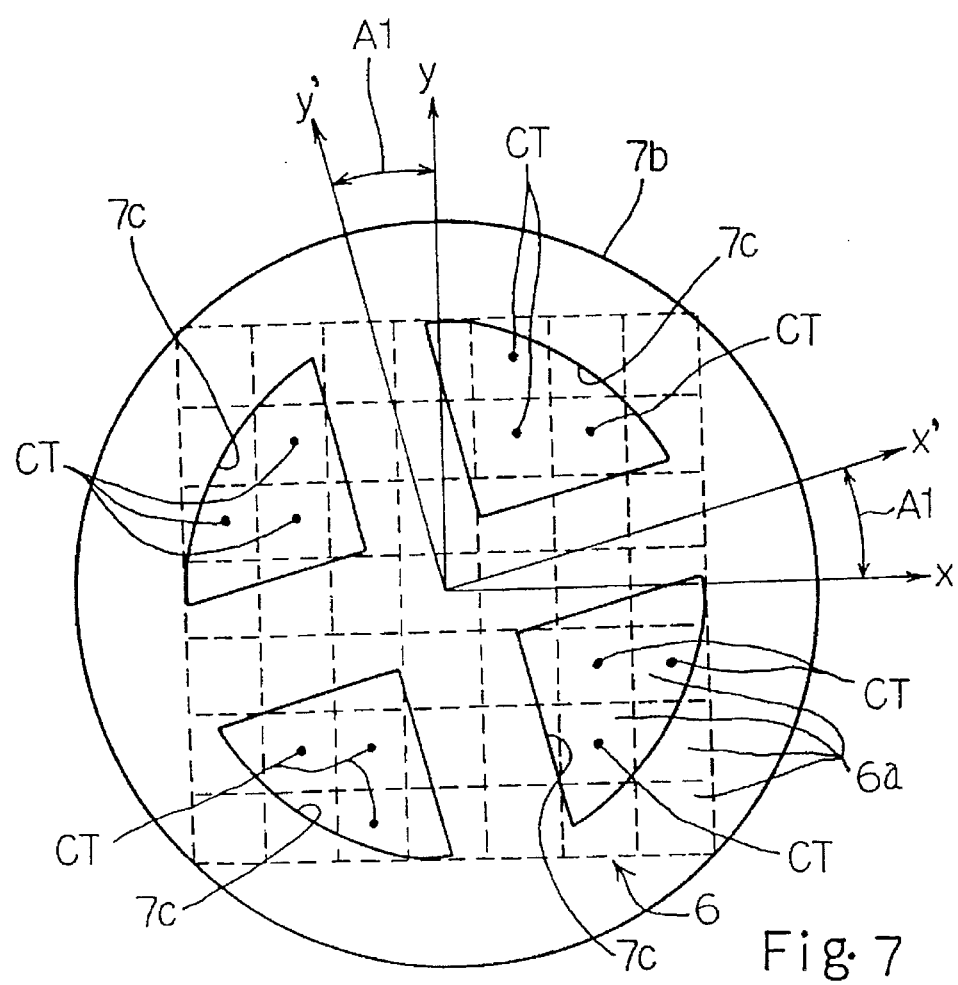
FIG. 7 is a plan view showing relative relation between a fly-eye lens and a diaphragm adjusted in accordance with the present invention.
Figure 5:
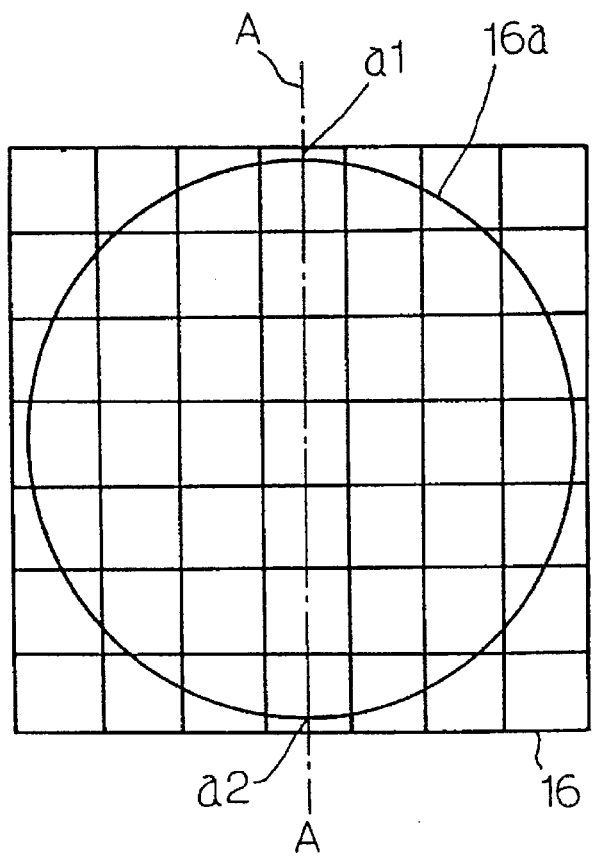
FIG. 5 is a plan view showing the fly-eye lens measured by the present inventor.
Figure 6:
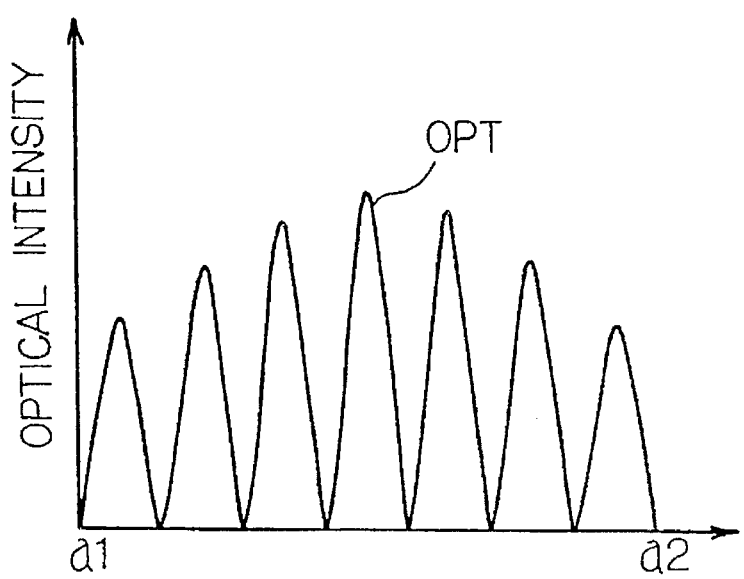
FIG. 6 is a graph showing the optical intensity along line A—A of FIG. 5.
Figure 11C:
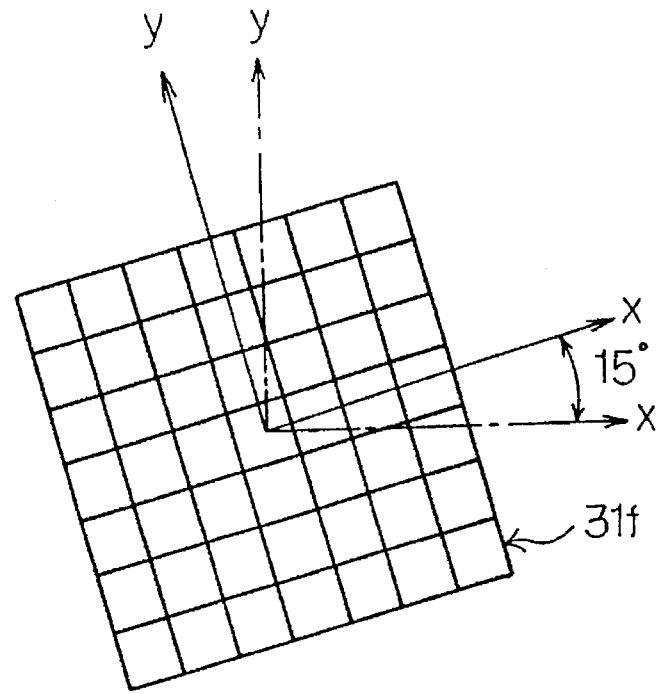
Figure 11D:
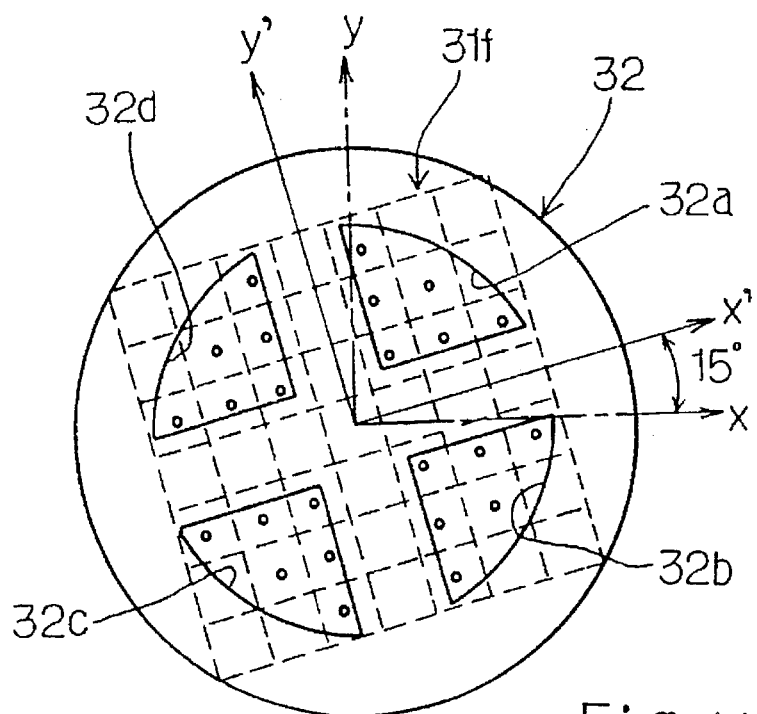

Thereafter, the controlling unit 37o calculates the number of driving pulses corresponding to an angular motion of the fly-eye lens 31f to 15 degrees with respect to the standard position. Then, the controlling unit 37o supplies the driving pulses to the stepping motor 37e, and the stepping motor 37e adjusts the lens-barrel 37g and the fly-eye lens 37f to the angular position declining at 15 degrees from the standard position. As a result, x–y axes decline at 15 degrees with respect to the standard orthogonal coordinates x–y as shown in FIG. 11C, and the fly-eye lens 31f is aligned with the diaphragm 32 as shown in FIG. 11D. The standard orthogonal coordinates x–y are aligned with the symmetrical lines x"–y" as well as the directions D2 and D1, and the centers (represented by bubbles) of the single lens units (represented by small squares) are regularly distributed to the four sectoral openings 32a to 32d. The fly-eye lens 31f thus aligned with the diaphragm 32 increases the intensity of the partial coherent light passing through the sectoral openings 32a to 32d. In fact, if the fly-eye lens 31f is offset from the diaphragm 32 as shown in FIG. 7, only three centers of the single lens units are aligned with each sectoral opening 32a/32b/32c/32d. However, when the standard orthogonal coordinates x–y of the fly-eye lens unit 31f are matched with the standard orthogonal coordinates x"–y" of the diaphragm 32, the fly-eye lens unit 31f aligns six centers of the single lens units with each of the sectoral opening 32a/32b/32c/32d as shown in FIG. 11D, and, as a result, the illuminance is twice as large as that of the prior art. The centers of single lens units for each sectoral opening are similar in arrangement to those of the other sectoral openings, and the resolution becomes not only high but also uniform.

Second Embodiment

Figure 12:
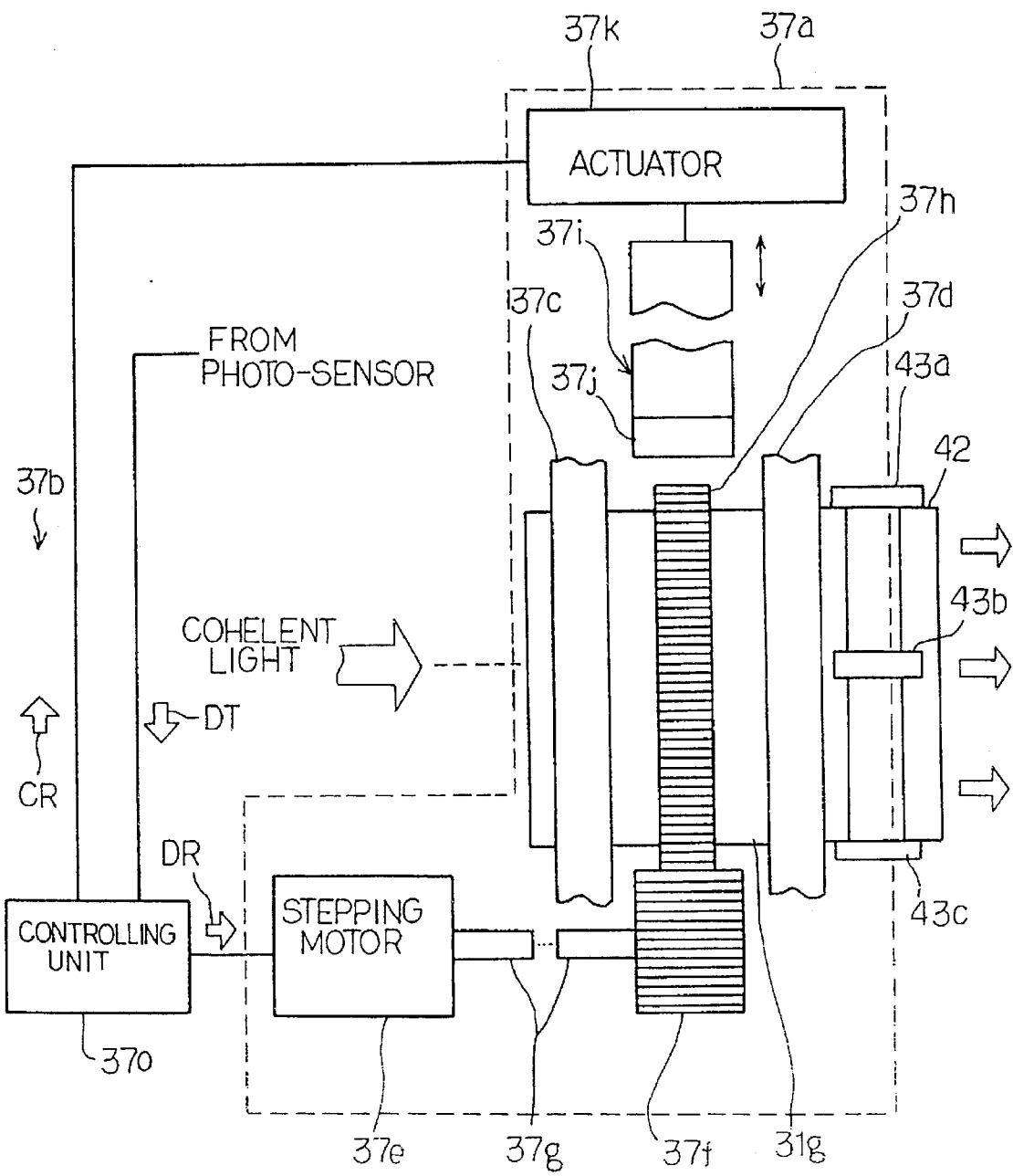
FIG. 12 is a side view showing a lens-barrel coupled with a diaphragm incorporated in another reduction projection aligner according to the present invention.

Turning to FIG. 12 of the drawings, a diaphragm 42 is connected to the lens-barrel 31g by means of suitable coupling members 43a, 43b and 43c. The diaphragm 42 and the lens-barrel 31g form parts of another reduction projection aligner implementing the present invention. The other structure of the reduction projection aligner implementing the second embodiment is similar to that of the first embodiment, and component members of the second embodiment are labeled with the same references designating the corresponding members of the first embodiment without detailed description for the sake of simplicity.

Figure 13A:
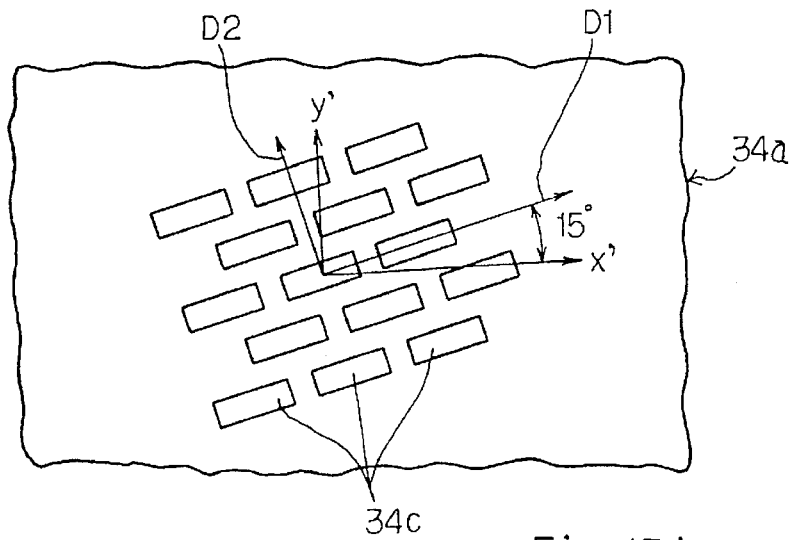
FIGS. 13A to 13C are plan views showing relation among a fly-eye lens, a diaphragm and a pattern image on a reticle for the reduction projection aligner.
Figure 13B:
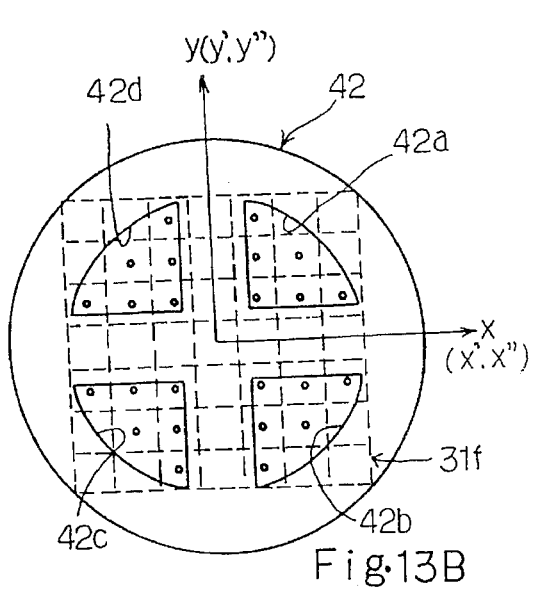
Figure 13C:
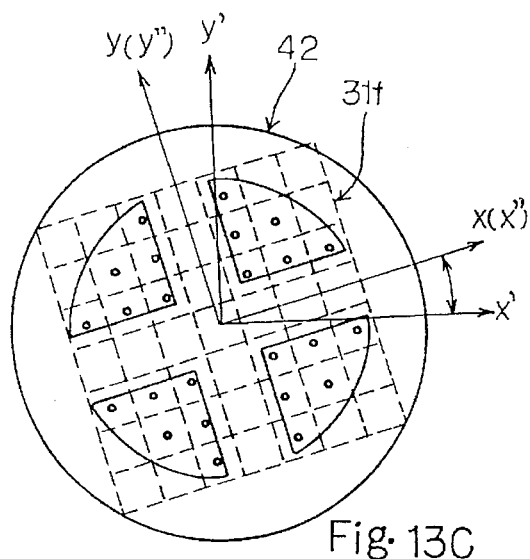

Assuming now that the reticle pattern 34c of the reticle 34a is similar to that of the first embodiment as shown in FIG. 13A, the orthogonal coordinates x–y of the fly-eye lens 31f are aligned with the orthogonal coordinates x'–y' of the reticle 34a, and the orthogonal coordinates x"–y" of the diaphragm 42 are also aligned with the standard coordinates x'–y' as shown in FIG. 13B. The centers of the single lens units are indicated by small bubbles, and are exposed to the sectoral openings 42a, 42b, 42c and 42d in a certain pattern. The controlling subsystem 37b causes the driving mechanism 37a to rotate the lens-barrel 31g over 15 degrees, and the fly-eye lens 31f and the diaphragm 42 simultaneously decline from the standard orthogonal coordinates x'–y' at 15 degrees as shown in FIG. 13C. The exposure pattern of the single lens units is unchanged. The reduction projection aligner of the second embodiment achieves all the advantages of the first embodiment, and the diaphragm 42 is used for reticle patterns only different in the orientation from the reticle pattern 34c.

Third Embodiment

Figure 14:
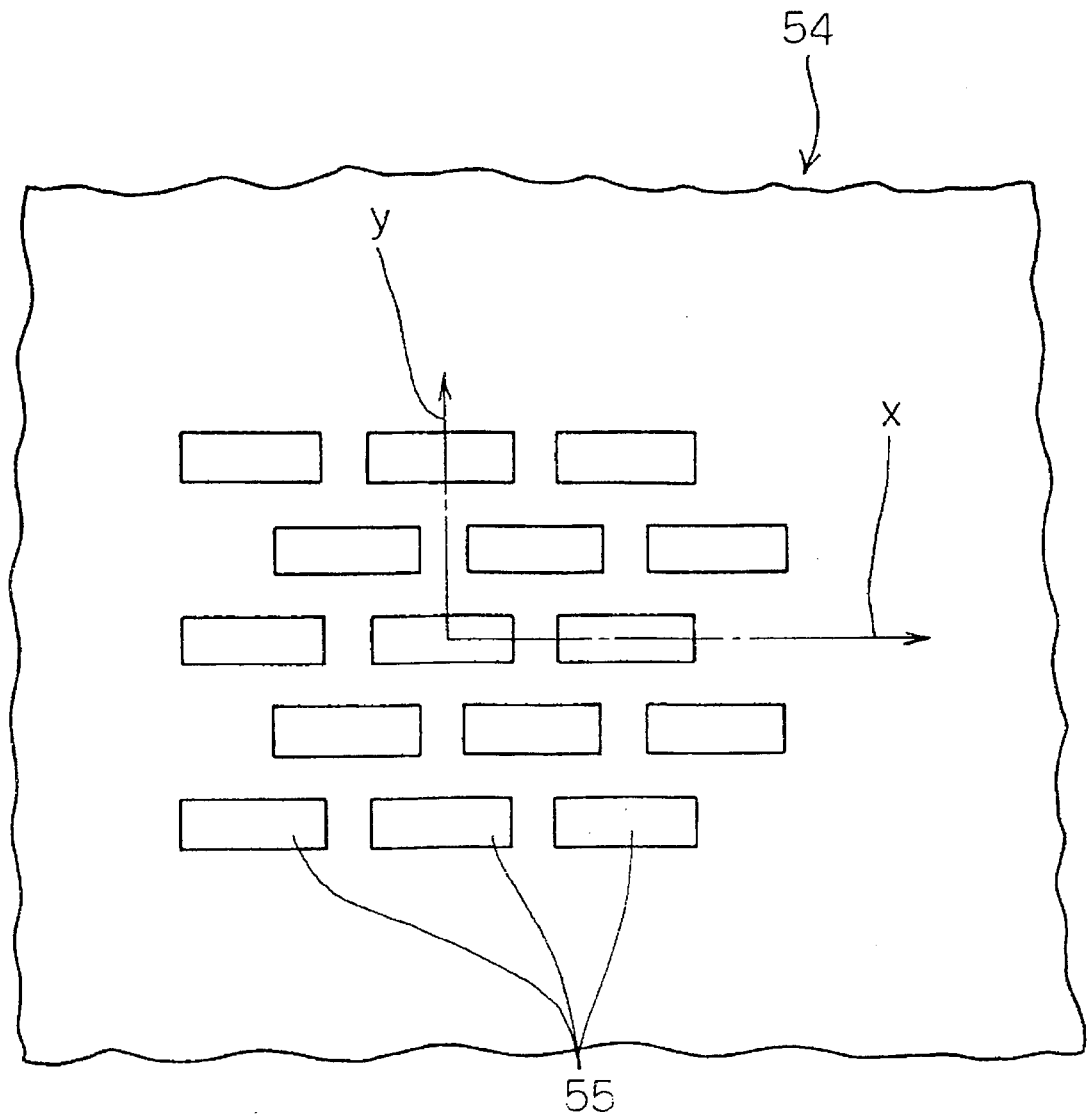
FIG. 14 is a plan view showing a reticle pattern of a reticle used in the reduction projection aligners according to the present invention.

A reduction projection aligner implementing the third embodiment is similar to the first embodiment except for a reticle 54 shown in FIG. 14, and no description on the projection aligner is incorporated hereinbelow. The reticle 54 has a reticle pattern 55 extending parallel to the x-axis, and is repeated in parallel to the y-axis.

Figure 15A:
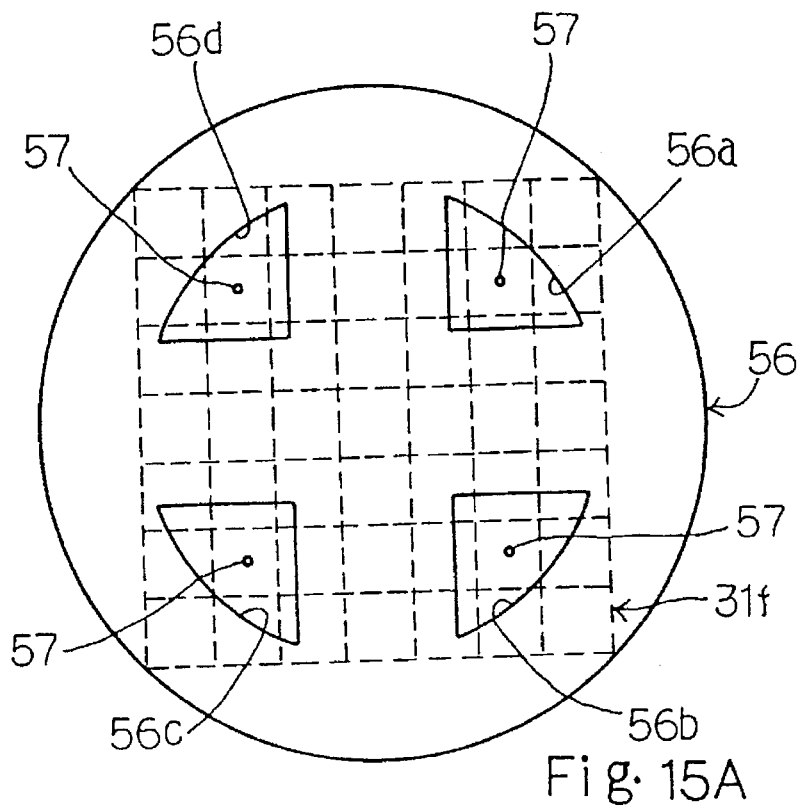
FIGS. 15A and 15B are plan views showing relation among a fly-eye lens unit, a diaphragm and a pattern image on a reticle for yet another reduction projection aligner according to the present invention.
Figure 15B:
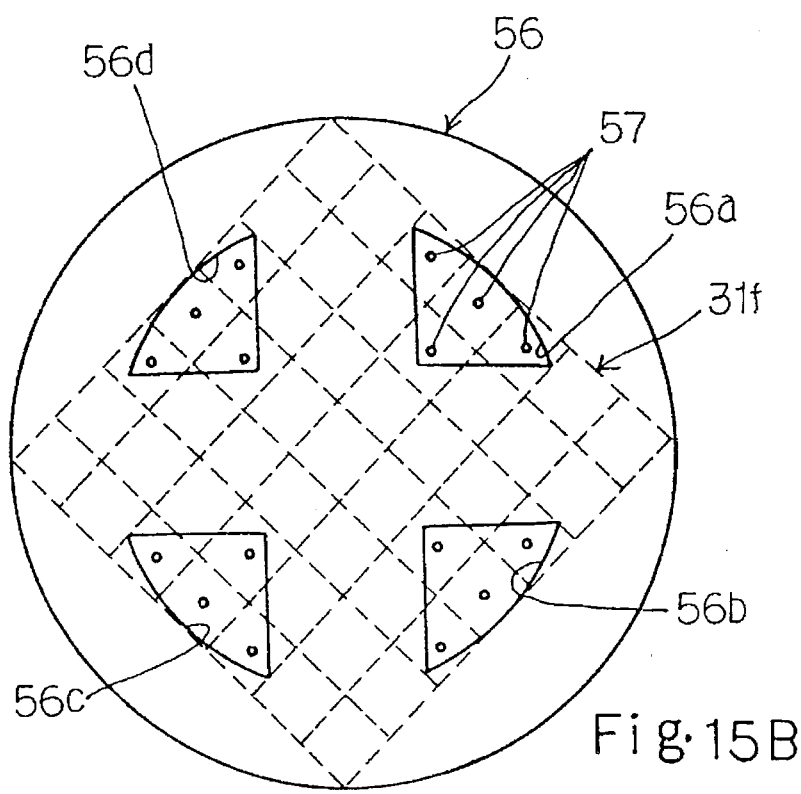

Although the advantages of the present invention have been described in connection with the reticle pattern 34c obliquely oriented with respect to the standard orthogonal coordinates x–y, the rotatable fly-eye lens 31f is also effective for the reticle 54. In detail, if the reticle pattern 55 is in parallel to the x-axis and y-axis, and the fly-eye lens 31f is stays at the starting position, and a diaphragm 56 for the four-point illumination may have four sectoral openings 56a, 56b, 56c and 56d each allowing only one center 57 of the single lens unit to be exposed thereto as shown in FIG. 15A. However, if the fly-eye lens 31f declines at 45 degrees as shown in FIG. 15B, the four single lens units expose the centers 57 thereof to each of the sectoral openings 56a, 56b, 56c and 56d, and the illuminance is drastically increased.

Fourth Embodiment

Figure 16:
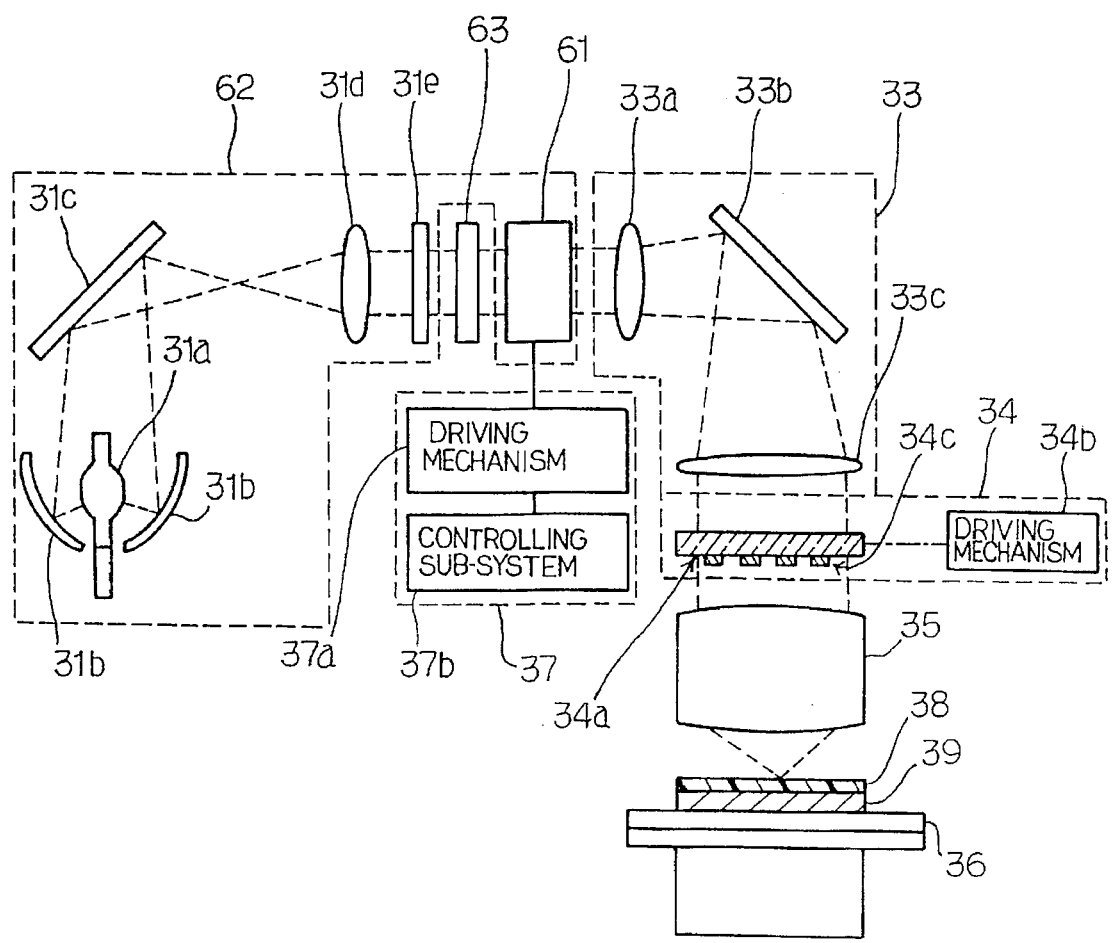
FIG. 16 is a schematic view showing yet another reduction projection aligner according to the present invention.

FIG. 16 illustrates yet another reduction projection aligner embodying the present invention. A fly-eye lens 61 of a partial coherent light generating system 62 is exchanged with a diaphragm 63, and is placed at a closer position to the lens unit 33a than the diaphragm 63. The rest of the apparatus is similar to that of either first or second embodiment, and components of the fourth embodiment are labeled with the same references as those of the first embodiment without detailed description.

The reduction projection aligner implementing the fourth embodiment achieves all the advantages of the present invention.

Although particular embodiments of the present invention have been shown and described, it will be obvious to those skilled in the art that various changes and modifications may be made without departing from the spirit and scope of the present invention.

The present invention appertains to any kind of aligner equipped with a fly-eye lens, a diaphragm and a reticle, and the diaphragm may have an opening or openings different from the sector. The photo-resist layer 38 may be provided on an insulating layer or a conductive layer.

What is claimed is:

1. An aligner for transferring a pattern image from a reticle to a photo-sensitive layer, comprising:

a partial coherent light generating system having a fly-eye lens implemented by a plurality of single lens units for producing a partial coherent light;

a diaphragm having an open area so as to cause said partial coherent light to be incident into said reticle for generating said pattern image fallen onto said photo-sensitive layer; and a rotating system associated with said fly-eye lens for regulating the relative relation between said fly-eye lens and said reticle through a rotation of said fly-eye lens to a predetermined angular position with respect to standard coordinates.

2. The aligner as set forth in claim 1, in which said reticle has a reticle pattern extending in a first direction and repeated in a second direction, said first direction and said second direction declining at a certain angle with respect to said standard coordinates, said open area being constituted by a plurality of open sub-areas symmetrical with respect to at least one symmetrical line matched with one of said first and second directions.

3. The aligner as set forth in claim 1, in which said reticle has a reticle pattern extending in a first direction and repeated in a second direction, said first direction and said second direction declining at a certain angle with respect to said standard coordinates, said open area being constituted by a plurality of open sub-areas symmetrical with respect to at least one symmetrical line matched with one of said first and second directions, and said predetermined angular position being equal to said certain angle with respect to said standard coordinates.

4. The aligner as set forth in claim 1, in which said open area is constituted by a plurality of open sub-areas, and said rotating system rotates said fly-eye lens to said predetermined angular position to increase the number of centers of single lens units of said fly-eye lens exposed to each of said open sub-areas.

5. The aligner as set forth in claim 1, in which said diaphragm is rotatably supported and connected to said fly-eye lens by means of a coupling means.

6. The aligner as set forth in claim 1, in which said partial coherent light generating system further comprises a light source for generating incoherent light, a guide mirror unit provided around said light source for condensing said incoherent light, a cold mirror provided on an optical path for a condensed incoherent light reflected on said guide mirror for eliminating long-wave light components from said condensed incoherent light, a lens unit provided on an optical path for a long-wave eliminated light reflected on said cold mirror for producing a parallel light, and an interference filter unit provided on an optical path for said parallel light for generating said partial coherent light incident into said fly-eye lens.

7. The aligner as set forth in claim 1, further comprising an optical path guide system provided between said diaphragm and said reticle for bending an optical path passing through said diaphragm, and a projection lens unit provided between said reticle and said photo-sensitive layer.

8. A projection aligner for transferring a pattern image from a reticle to a photo-sensitive layer, comprising:

a partial coherent light generating system having a fly-eye lens comprising a plurality of single lens units for producing a partial coherent light, said partial coherent light illuminating said reticle for generating said pattern image on said photo-sensitive layer;

a diaphragm having an open area so as to transfer said partial coherent light to said reticle; and a rotating system associated with said fly-eye lens for regulating the relative relation between said fly-eye lens and said reticle through a rotation of said fly-eye lens to a predetermined position.

9. A projection aligner for transferring a pattern image from a reticle to a photo-sensitive layer, said reticle having a reticle pattern extending in a first direction and repeated in a second direction, comprising a partial coherent light generating system having a light source for generating an incoherent light, a guide mirror unit provided around said light source for condensing said incoherent light, a cold mirror provided on an optical path for a condensed incoherent light reflected on said guide mirror for eliminating long-wave light components from said condensed incoherent light, a lens unit provided on an optical path for a long-wave eliminated light reflected on said cold mirror for producing a parallel light, an interference filter unit provided on an optical path for said parallel light for generating a partial coherent light, and a fly-eye lens provided on an optical path for said partial coherent light passing through said interference filter unit, and comprising a plurality of single lens units for decreasing variation of the intensity of said partial coherent light, said plurality of single lens units being arranged in symmetry with respect to at least one first symmetrical line;

a diaphragm provided on an optical path for said partial coherent light passing through said fly-eye lens, and having a plurality of open areas symmetry with respect to at least one second symmetrical line, said at least one second symmetrical line being aligned with one of said first and second directions of said reticle pattern;

an optical path guide system provided between said diaphragm and said reticle for bending an optical path passing through said diaphragm;

a projection lens unit provided between said reticle and said photo-sensitive layer; and a rotating system provided for rotating said fly-eye lens to a predetermined position wherein said at least one first symmetrical line and said at least one second symmetrical line are aligned with each other.

10. The projection aligner as set forth in claim 9, in which said diaphragm is rotatably supported and connected to said fly-eye lens by means of a coupling means.

* * * * *